US009805965B2

(12) United States Patent
Sadjadi et al.

(10) Patent No.: US 9,805,965 B2
(45) Date of Patent: *Oct. 31, 2017

(54) PIXELATED CAPACITANCE CONTROLLED ESC

(71) Applicant: Applied Materials, Inc., Santa Clara, CA (US)

(72) Inventors: Reza Sadjadi, San Jose, CA (US); Wendell Glen Boyd, Jr., Morgan Hill, CA (US); Vijay D. Parkhe, San Jose, CA (US); Maxim Mikhailovich Noginov, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/395,938

(22) Filed: Dec. 30, 2016

(65) Prior Publication Data

US 2017/0110358 A1    Apr. 20, 2017

Related U.S. Application Data

(63) Continuation of application No. 15/268,087, filed on Sep. 16, 2016, now Pat. No. 9,536,769, which is a (Continued)

(51) Int. Cl.
*H02N 13/00* (2006.01)
*H01L 21/683* (2006.01)
(Continued)

(52) U.S. Cl.
CPC .... *H01L 21/6833* (2013.01); *H01J 37/32697* (2013.01); *H01J 37/32715* (2013.01);
(Continued)

(58) Field of Classification Search
CPC .. H01L 21/6833; H01L 21/6831; H02N 13/00
(Continued)

(56) References Cited

U.S. PATENT DOCUMENTS 6,490,146 B2  12/2002 Wang et al.
6,538,872 B1   3/2003 Wang et al.
(Continued)

FOREIGN PATENT DOCUMENTS

CN   101278385 A   10/2008
CN   102834913 A   12/2012
JP   H09213778 A    8/1997

OTHER PUBLICATIONS

Office Action from Taiwanese Patent Application No. 104105345 dated Mar. 30, 2017.
(Continued)

*Primary Examiner* — Dharti Patel
(74) *Attorney, Agent, or Firm* — Patterson + Sheridan LLP

(57) ABSTRACT

Implementations described herein provide a chucking circuit for a pixilated electrostatic chuck which enables both lateral and azimuthal tuning of the RF coupling between an electrostatic chuck and a substrate placed thereon. In one embodiment, a chucking circuit for an electrostatic chuck (ESC) has one or more chucking electrodes disposed in a dielectric body of the ESC, a plurality of pixel electrodes disposed in the dielectric body, and a chucking circuit having the one or more chucking electrodes and the plurality of pixel electrodes, the chucking circuit operable to electrostatically chuck a substrate to a workpiece support surface of the ESC, the chucking circuit having a plurality of secondary circuits, wherein each secondary circuit includes at least one capacitor of a plurality of capacitors, each secondary circuit
(Continued)

is configured to independently control an impedance between one of the pixel electrodes and a ground.

9 Claims, 5 Drawing Sheets

Related U.S. Application Data continuation of application No. 14/276,790, filed on May 13, 2014, now Pat. No. 9,472,410.

(60) Provisional application No. 61/948,519, filed on Mar. 5, 2014.

(51) Int. Cl.
*H01L 27/12* (2006.01)
*H01L 21/67* (2006.01)
*H01J 37/32* (2006.01)
*H01L 29/93* (2006.01)

(52) U.S. Cl.
CPC .... *H01L 21/67063* (2013.01); *H01L 27/1255* (2013.01); *H01J 2237/334* (2013.01); *H01L 21/67103* (2013.01); *H01L 29/93* (2013.01)

(58) Field of Classification Search
USPC .......................................... 361/234
See application file for complete search history.

(56) References Cited

U.S. PATENT DOCUMENTS

| | | | |
|---|---|---|---|
| 6,740,853 B1 | 5/2004 | Johnson et al. | |
| 7,777,152 B2 * | 8/2010 | Todorov ............ | H01J 37/32706 118/723 E |
| 8,226,769 B2 | 7/2012 | Matyushkin et al. | |
| 8,461,674 B2 | 6/2013 | Gaff et al. | |
| 8,546,732 B2 | 10/2013 | Singh | |
| 8,587,113 B2 | 11/2013 | Gaff et al. | |
| 8,624,168 B2 | 1/2014 | Gaff et al. | |
| 8,637,794 B2 | 1/2014 | Singh et al. | |
| 8,642,480 B2 | 2/2014 | Gaff et al. | |
| 8,663,391 B2 | 3/2014 | Matyushkin et al. | |
| 8,884,194 B2 | 11/2014 | Singh et al. | |
| 8,901,835 B2 | 12/2014 | Kang et al. | |
| 8,901,935 B2 | 12/2014 | Valcore, Jr. et al. | |
| 8,908,348 B2 | 12/2014 | Wang et al. | |
| 8,937,800 B2 | 1/2015 | Lubomirsky et al. | |
| 9,196,514 B2 | 11/2015 | Parkhe et al. | |
| 9,472,410 B2 * | 10/2016 | Sadjadi | |
| 2005/0016471 A1 | 1/2005 | Chiang et al. | |
| 2005/0031796 A1 | 2/2005 | Wu et al. | |
| 2005/0272227 A1 | 12/2005 | Moriya et al. | |
| 2007/0014073 A1 | 1/2007 | Retzlaff | |
| 2008/0017104 A1 | 1/2008 | Matyushkin et al. | |
| 2009/0059462 A1 | 3/2009 | Mizuno et al. | |
| 2009/0135540 A1 | 5/2009 | Poh | |
| 2009/0274590 A1 | 11/2009 | Willwerth et al. | |
| 2010/0163188 A1 | 7/2010 | Tanaka et al. | |
| 2011/0013338 A1 | 1/2011 | Fujii | |
| 2011/0090719 A1 | 4/2011 | Benjamin | |
| 2011/0147363 A1 | 6/2011 | Yap et al. | |
| 2012/0091482 A1 | 4/2012 | Uchida et al. | |
| 2012/0285619 A1 | 11/2012 | Matyushkin et al. | |
| 2013/0161305 A1 | 6/2013 | Ptasienski et al. | |
| 2013/0220989 A1 | 8/2013 | Pease et al. | |
| 2014/0004702 A1 | 1/2014 | Singh | |
| 2014/0020834 A1 | 1/2014 | Zhou et al. | |
| 2014/0045337 A1 | 2/2014 | Singh et al. | |
| 2014/0047705 A1 | 2/2014 | Singh et al. | |
| 2014/0048529 A1 | 2/2014 | Pease | |
| 2014/0096909 A1 | 4/2014 | Singh et al. | |
| 2014/0154819 A1 | 6/2014 | Gaff et al. | |
| 2015/0129165 A1 | 5/2015 | Parkhe et al. | |
| 2015/0155193 A1 | 6/2015 | Hsu et al. | |
| 2015/0170977 A1 | 6/2015 | Singh | |
| 2015/0187625 A1 | 7/2015 | Busche et al. | |
| 2015/0187626 A1 | 7/2015 | Parkhe et al. | |
| 2015/0228513 A1 | 8/2015 | Parkhe et al. | |
| 2015/0311105 A1 | 10/2015 | Sadjadi et al. | |
| 2015/0364354 A1 | 12/2015 | Tantiwong et al. | |
| 2015/0366004 A1 | 12/2015 | Nangoy et al. | |
| 2016/0027678 A1 | 1/2016 | Parkhe et al. | |

OTHER PUBLICATIONS

Office Action from Chinese Patent Application No. 201580007797.0 dated Apr. 6, 2017.
International Search Report and Written Opinion for PCT/US2015/029725 dated Aug. 19, 2015.

* cited by examiner

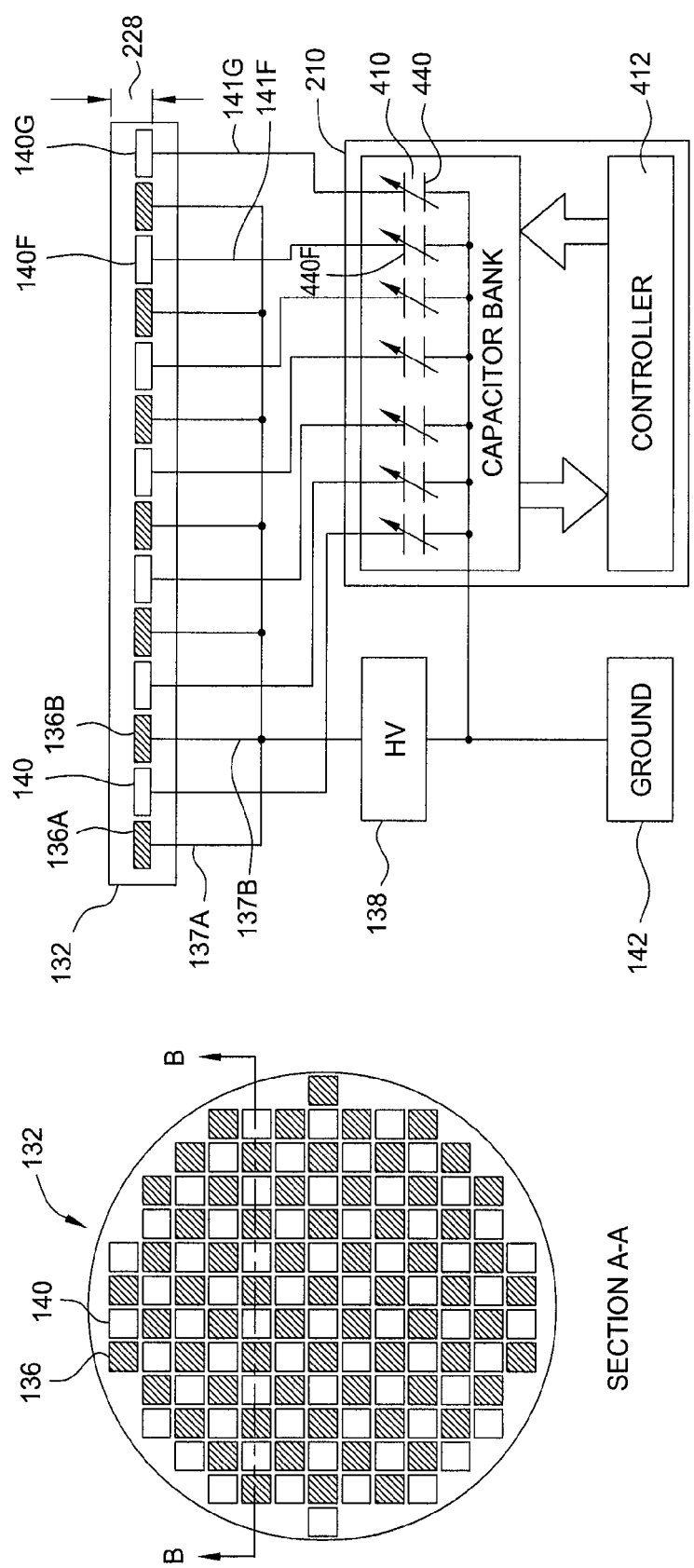

PIXELATED CAPACITANCE CONTROLLED ESC

CROSS-REFERENCE TO RELATED APPLICATIONS

This application is a continuation application of U.S. patent application Ser. No. 15/268,087, filed Sep. 16, 2016, now U.S. Pat. No. 9,536,769, which is a continuation application of U.S. patent application Ser. No. 14/276,790, filed May 13, 2014, now U.S. Pat. No. 9,472,410, which claims benefit of U.S. Provisional Application Ser. No. 61/984,519, filed Mar. 5, 2014 of which is incorporated by reference in its entirety.

BACKGROUND

Field

Implementations described herein generally relate to semiconductor manufacturing and more particularly to an electrostatic chuck and a method of using the same.

Description of the Related Art

As the feature size of the device patterns get smaller, the critical dimension (CD) requirements of these features become a more important criterion for stable and repeatable device performance. Allowable CD variation across a substrate processed within a processing chamber is difficult to achieve due to chamber asymmetries such as chamber and substrate temperature, flow conductance, and RF fields.

In processes utilizing an electrostatic chuck, uniformity of etching across the surface of the substrate is challenging due to the non-homogeneous construction of the chuck below the substrate. For example, some regions of the electrostatic chuck have gas holes, while other regions have lift pin holes that are laterally offset from the gas holes. Still other regions have chucking electrodes, while other regions have heater electrodes that are laterally offset from the chucking electrodes. The non-homogeneous construction of the chuck leads to non-uniformity of the radio frequency (RF) fields which directly affect the etching across the surface of the substrate.

The structure of the electrostatic chuck can vary both laterally and azimuthally, uniformity of the RF field between the chuck and substrate is complicated and very difficult to obtain, resulting in local variability in the RF field across the chuck surface. Plasma based processes can be very sensitive to small local RF coupling variations to the electrostatic chuck. Thus, the local RF coupling variations result in non-uniformity of the processing results along the surface of the substrate.

Thus, there is a need for an improved electrostatic chuck.

SUMMARY

Implementations described herein provide a chucking circuit for a pixilated electrostatic chuck which enables both lateral and azimuthal tuning of the RF coupling between an electrostatic chuck and a substrate placed thereon. In one embodiment, a chucking circuit for an electrostatic chuck (ESC) has one or more chucking electrodes disposed in a dielectric body of the ESC, a plurality of pixel electrodes disposed in the dielectric body, and a chucking circuit having the one or more chucking electrodes and the plurality of pixel electrodes, the chucking circuit operable to electrostatically chuck a substrate to a workpiece support surface of the ESC, the chucking circuit having a plurality of secondary circuits, wherein each secondary circuit includes at least one capacitor of a plurality of capacitors, each secondary circuit is configured to independently control an impedance between one of the pixel electrodes and a ground.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

FIG. 3 is a partial top plan view depicting a layout for adjustable capacitors and electrodes in the pixelated electrostatic chuck;

FIG. 4 is a cross-sectional views taken along the section line A-A of FIG. 3, illustrating a simplified wiring schematic for capacitors in the pixelated electrostatic chuck;

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Figure 1:
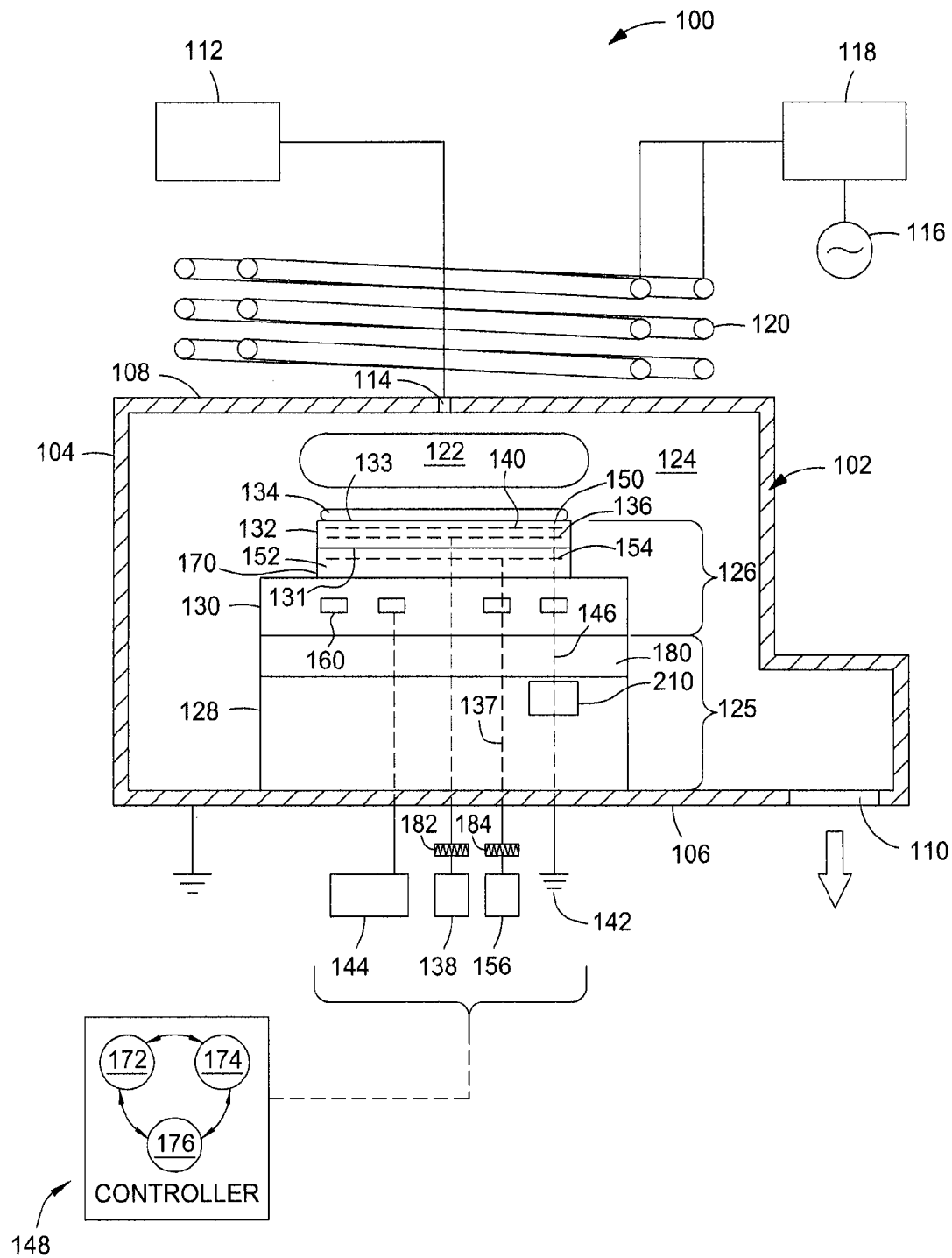
FIG. 1 is a cross-sectional schematic side view of a processing chamber having one embodiment of a pixelated electrostatic chuck.

As the semiconductor industry is reducing the electronic feature sizes to sub-nm levels, the etch rate and CD uniformity requirements are also shrinking to Angstrom levels which is nearing atomic sizes. In such cases, substrate temperatures must either be very uniform, for example less than about 0.5° Celsius for nodes smaller than 20 nm, or tunable with a very fine resolution to tailor the process uniformity across substrates. However, for semiconductor technology nodes smaller than 10 nm, even temperature uniformity as low as 0.25° Celsius or less is not sufficient to maintain process uniformity. One factor effecting process uniformity is the dielectric depth of the chucking electrode within the puck of the electrostatic chuck. The dielectric depth is a distance between the top of the puck and the high voltage grid comprising the chucking electrode. The topography of the puck's substrate support surface and dielectric depth both significantly influence RF coupling of a substrate to the ESC. Stronger coupling of the radio frequency (RF) to the substrate can increase the etch rate and vice versa. Thus, controlling the local capacitance of the workpiece to ground laterally across an ESC is an important process control parameter which the invention disclosed herein has been demonstrated as effective process control attribute for tailoring the lateral and/or azimuthal etch rate uniformity and/or CD control of processes performed using an ESC.

Implementations described herein provide a pixelated electrostatic chuck (ESC) which enables local, lateral and azimuthal tuning of the RF coupling of the pixelated ESC and a workpiece, such as a substrate, which in turn, allows both lateral and azimuthal tuning of the lateral RF coupling of the substrate, on the pixelated ESC, to the ground. Moreover, the control of local variations in the capacitance in the pixelated ESC, for coupling of the substrate to the ground, substantially enhances the processes performed thereon by eliminating or, in some cases, inducing process variations influenced by the RF coupling. Thus, the pixelated ESC enables angstrom-level etch rate & critical dimension (CD) uniformity control between almost any locations across the substrate. Methods for tuning the RF coupling for a substrate processed on a pixelated ESC are also described herein. Although the pixelated ESC is described below in an etch processing chamber, the pixelated ESC may be utilized in other types of plasma processing chambers, such as physical vapor deposition chambers, chemical vapor deposition chambers, ion implantation chambers, among others, and other systems where at least one of azimuthal, lateral and/or local tuning of a RF profile across the substrate support surface of the ESC is desirable. It is also contemplated that the pixelated electrodes may also be utilized to control the RF bias or coupling of other surfaces, including those not used for semiconductor processing.

In one or more embodiments, the pixelated ESC allows for the correction of critical dimension (CD) variation at the edge or other locations across the substrate during a vacuum process, such as etching, deposition, implantation and the like, by utilizing the pixel electrodes to compensate for chamber non-uniformities, such as temperature, flow conductance, electrical fields, plasma density and the like. Additionally, some embodiments have demonstrated the ability to control the capacitance of the substrate to the ground anywhere from about 20 pF to about several hundred pF.

FIG. 1 is a cross-sectional schematic view of an exemplary etch processing chamber 100 having a pixelated ESC 132. As discussed above, the pixelated ESC 132 may be utilized in other processing chamber, for example plasma treatment chambers, annealing chambers, physical vapor deposition chambers, chemical vapor deposition chambers, and ion implantation chambers, among others, as well as other systems where the ability to control a RF profile coupling a surface or workpiece, such as a substrate, to a ground is desirable. Independent and local control of the RF coupling across many discrete regions of a surface (i.e., the substrate support surface of the pixelated ESC 132) beneficially enables lateral and/or azimuthal tuning of the RF profile and reduction of local RF asperities, such as high or low RF coupling, which may affect local process results in the etch processing chamber 100.

The processing chamber 100 includes a grounded chamber body 102. The chamber body 102 includes walls 104, a bottom 106 and a lid 108 which enclose an internal volume 124. A substrate support assembly 126 is disposed in the internal volume 124. The pixelated ESC 132 is disposed on the substrate support assembly 126 and supports a substrate 134 thereon during processing.

The walls 104 of the processing chamber 100 include an opening (not shown) through which the substrate 134 may be robotically transferred into and out of the internal volume 124. A pumping port 110 is formed in one of the walls 104 or the bottom 106 of the chamber body 102 and is fluidly connected to a pumping system (not shown). The pumping system is utilized to maintain a vacuum environment within the internal volume 124 of the processing chamber 100, while removing processing byproducts.

A gas panel 112 provides process and/or other gases to the internal volume 124 of the processing chamber 100 through one or more inlet ports 114 formed through at least one of the lid 108 or walls 104 of the chamber body 102. The process gas provided by the gas panel 112 are energized within the internal volume 124 to form a plasma 122 utilized to process the substrate 134 disposed on the pixelated ESC 132. The process gases may be energized by RF power inductively coupled to the process gases from a plasma applicator 120 positioned outside the chamber body 102. In the embodiment depicted in FIG. 1, the plasma applicator 120 is a pair of coaxial coils coupled through a matching circuit 118 to an RF power source 116 or a capacitively coupled plasma (CCP) chamber.

A controller 148 is coupled to the processing chamber 100 to control operation of the processing chamber 100 and processing of the substrate 134. The controller 148 may be one of any form of general-purpose data processing system that can be used in an industrial setting for controlling the various subprocessors and subcontrollers. Generally, the controller 148 includes a central processing unit (CPU) 172 in communication with memory 174 and input/output (I/O) circuitry 176, among other common components. Software commands executed by the CPU of the controller 148, cause the processing chamber to, for example, introduce an etchant gas mixture (i.e., processing gas) into the internal volume 124, form the plasma 122 from the processing gas by application of RF power from the plasma applicator 120, and etch a layer of material present on the substrate 134.

The substrate support assembly 126 generally includes at least a substrate support. In the embodiment of FIG. 1, the substrate support is an electrostatic chuck and will be described hereinafter as the pixelated ESC 132. The substrate support assembly 126 may additionally include a heater assembly 170. The substrate support assembly 126 may also include a cooling base 130. The cooling base may alternately be separate from the substrate support assembly 126. The substrate support assembly 126 may be removably coupled to a support pedestal 125. The support pedestal 125 is mounted to the chamber body 102 and may include a pedestal base 128. The support pedestal 125 may optionally include a facility plate 180. The substrate support assembly 126 may be periodically removed from the support pedestal 125 to allow for refurbishment of one or more components of the substrate support assembly 126.

The facility plate 180 is configured to accommodate a plurality of driving mechanism configured to raise and lower a plurality of lifting pins. Additionally, the facility plate 180 is configured to accommodate the plurality of fluid connections from the pixelated ESC 132 and the cooling base 130. The facility plate 180 is also configured to accommodate the plurality of electrical connections from the pixelated ESC 132 and the heater assembly 170. The myriad of connections may run externally or internally of the substrate support assembly 126 while the facility plate 180 provides an interface for the connections to a respective terminus.

The temperature controlled cooling base 130 is coupled to a heat transfer fluid source 144. The heat transfer fluid source 144 provides a heat transfer fluid, such as a liquid, gas or combination thereof, which is circulated through one or more conduits 160 disposed in the cooling base 130. The fluid flowing through neighboring conduits 160 may be isolated to enabling local control of the heat transfer between the pixelated ESC 132 and different regions of the cooling base 130, which assists in controlling the lateral temperature profile of the substrate 134.

In one or more embodiments, a fluid distributor may be fluidly coupled between an outlet of the heat transfer fluid source 144 and the temperature controlled cooling base 130. The fluid distributor operates to control the amount of heat transfer fluid provided to the conduits 160. The fluid distributor may be disposed outside of the processing chamber 100, within the substrate support assembly 126, within the pedestal base 128 or other suitable location.

The heater assembly 170 may include one or more main resistive heaters 154 and, optionally, a plurality of secondary heaters (not shown) embedded in a body 152. The main resistive heaters 154 may be provided to elevate the temperature of the substrate support assembly 126 to a temperature for conducting chamber processes. The secondary heaters, when present, may provide localized adjustments of a couple degrees Celsius to the temperature profile of the pixelated ESC 132 generated by the main resistive heaters 154. Thus, the main resistive heaters 154 operate on a globalized macro scale while the secondary heaters operate on a localized micro scale. The main resistive heaters 154 are coupled through an RF filter 184 to a main heater power source 156. The power source 156 may provide 500 watts or more power to the main resistive heaters 154. The controller 148 may control the operation of the main heater power source 156, which is generally set to heat the substrate 134. In one or more embodiments, the main resistive heaters 154 include a plurality of laterally separated heating zones, wherein the controller 148 enables one zone of the main resistive heaters 154 to be preferentially heated relative to the main resistive heaters 154 located in one or more of the other zones. For example, the main resistive heaters 154 may be arranged concentrically in a plurality of separated heating zones to enable edge to center temperature control.

Alternately, the one or more main resistive heaters 154, and/or the secondary heaters, may be formed in the pixelated ESC 132. In those embodiments where both the main resistive heaters 154 and the secondary heaters are formed in the pixelated ESC 132, the substrate support assembly 126 may be formed without the heater assembly 170 and the pixelated ESC 132 may be disposed directly on the cooling base 130.

The temperature of the surface for the substrate 134 in the processing chamber 100 may be influenced by the evacuation of the process gasses by the pump, the slit valve door, the plasma 122 and other factors. The cooling base 130, the one or more main resistive heaters 154, and the secondary heaters all help to control the surface temperature of the substrate 134.

The pixelated ESC 132 has a mounting surface 131 and a workpiece surface 133 opposite the mounting surface 131. The workpiece surface 133 of the pixelated ESC 132 may include gas passages (not shown) for providing backside heat transfer gas to the interstitial space defined between the substrate 134 and the workpiece surface 133 of the pixelated ESC 132. The pixelated ESC 132 may also include lift pin holes for accommodating lift pins (both not shown) for elevating the substrate 134 above the workpiece surface 133 of the pixelated ESC 132 to facilitate robotic transfer into and out of the processing chamber 100.

The pixelated ESC 132 generally includes a dielectric body 150 having one or more chucking electrode 136 embedded therein. The dielectric body 150 may also have one or more pixel electrodes 140 embedded therein. The pixel electrodes 140 may be coplanar with the chucking electrode 136. The pixel electrodes 140 may be interspersed with the chucking electrode 136, for example the pixel electrodes 140 may be arranged in a grid or polar array interspersed within apertures formed in as single chucking electrode 136, or interspersed among a plurality of chucking electrodes 136.

The pixel electrodes 140 and chucking electrode 136 may be integrated into the puck 228 directly using MEMS technology. Each pixel electrode 140 may be separated from an adjacent pixel electrode 140 by the chucking electrode 136. The pixel electrodes 140 and chucking electrode 136 may be formed by plating, ink jet printing, screen printing, physical vapor deposition, stamping, wire mesh or other suitable manner.

Referring back to the dielectric body 150, the dielectric body 150 may have a flat disk form configured to be the same as or slightly larger in diameter than the substrate. The dielectric body 150 may alternatively have other forms, such as rectangular, square, or other plan form. The dielectric body 150 may be fabricated from a ceramic material, such as AlN or $Al_2O_3$. When fabricated from a ceramic material, the dielectric body 150 may be referred to as a puck (shown as puck 228 in FIG. 2). Alternately, the dielectric body 150 may be fabricated from a polymer, such as polyimide, polyetheretherketone, polyaryletherketone and the like. When fabricated from a polymer, the dielectric body 150 may be referred to as a flex stack.

The body 150 of the pixelated ESC 132 may be formed from two or more layers heated under pressure to form a single mass for the body 150. For example, the body 152 may be formed from polyimide layers with the pixel electrodes 140 and the chucking electrodes 136 thereon or therebetween. In some embodiments, main resistive heaters 154 may be formed on or between the polyimide layers as well. Alternately, the pixelated ESC 132 may be formed from a ceramic material. The pixelated ESC 132 may be sintered and include one or more chucking electrodes 136 and pixel electrodes 140 embedded therein.

The chucking electrode 136 may be configured as a bipolar electrode, or other suitable arrangement. The chucking electrode 136 is coupled through an RF filter 182 to a chucking power source 138 which provides a RF or DC power to electrostatically secure the substrate 134 to the upper surface of the pixelated ESC 132. The RF filter 182 prevents RF power utilized to form a plasma 122 within the processing chamber 100 from damaging electrical equipment or presenting an electrical hazard outside the chamber. In one embodiment, the chucking power source 138 provides a high voltage to one or more chucking electrodes 136.

The plurality of pixel electrodes 140 may be disposed in the pixelated ESC 132 and arranged in close proximity to the chucking electrodes 136. The pixel electrodes 140 are coupled through pixel capacitors (shown in FIGS. 4 and 5) to a ground 142 via electrical leads 146. The pixel capacitors may be configured to have a fixed or variable capacitance, wherein the value of each pixel capacitor is selected to independently and locally control the RF coupling across many discrete regions of the pixelated ESC 132 to enable local, lateral and/or azimuthal tuning of power coupling between the substrates and ESC 132, which in turn enables local, lateral and/or azimuthal process results to be tuned in the etch processing chamber 100.

In one or more embodiments, the pixel capacitors may be variable capacitors whose capacitance may be changed mechanically or electronically. A pixel controller 210 may be utilized to control the capacitance of the pixel capacitors. The change in capacitance of the pixel capacitors may be utilized to affect the affinity of the coupling of power between the chucking electrode 136 through the substrate 134 to the ground 142 through the one or more pixel electrodes 140, whereby electrostatically chucking the substrate 134 to the pixelated ESC 132.

The pixel capacitors, together with resistors, inductors and memristors, belong to the group of "passive components" for electronic equipment utilized to deliver the chucking power while allowing tunable control of the processing results. The pixel capacitors may have fixed capacitance values and/or variable capacitors with variable (trimmer) or adjustable (tunable) capacitance values. The pixel capacitors may be a digitally tuned capacitor, such as an integrated circuit (IC) variable capacitor, whose capacitance may be controlled by the pixel controller 210. The capacitance values of the pixel capacitors may be configured to tune the RF signal to control an etch rate in the etch processing chamber 100.

In one or more embodiments, the pixel capacitors may be fabricated as solid state field-effect transistor (FET) switches. The pixel capacitors may be a microelectromechanical system (MEMS), barium strontium titanate (BST) based device, silicon-on-insulator (SOI) based device/silicon-on-sapphire (SOS) based device, ferroelectric based device, or other suitable device technology. MEMS devices are highly linear, and therefore are suitable for antenna aperture tuning, dynamic impedance matching, power amplifier load matching and adjustable filters. BST devices vary the capacitance by applying high voltage to the device. The tuning accuracy is limited only by the accuracy of the D-A converter circuitry that generates the high voltage. The BST devices have good stability over varying temperatures and linearity in demanding applications. SOI/SOS tuning devices use metal-insulator-metal (MIM) caps arranged in binary-weighted values to achieve different capacitance values. SOI/SOS switches have high linearity and are well suited to low power applications where high voltages are not present. High voltage endurance requires multiple FET devices in series which adds series resistance and lowers the quality factor. In one embodiment, the pixel electrodes 140 are digitally tuned variable MEMS devices.

Plasma based processes can be very sensitive to small local radio frequency (RF) coupling variations to an ESC. The pixelated ESC 132 allows surface capacitance to be controlled as to provide angstrom-level CD control of the etch rate at discrete locations across the lateral profile of the substrate 134.

Figure 2:
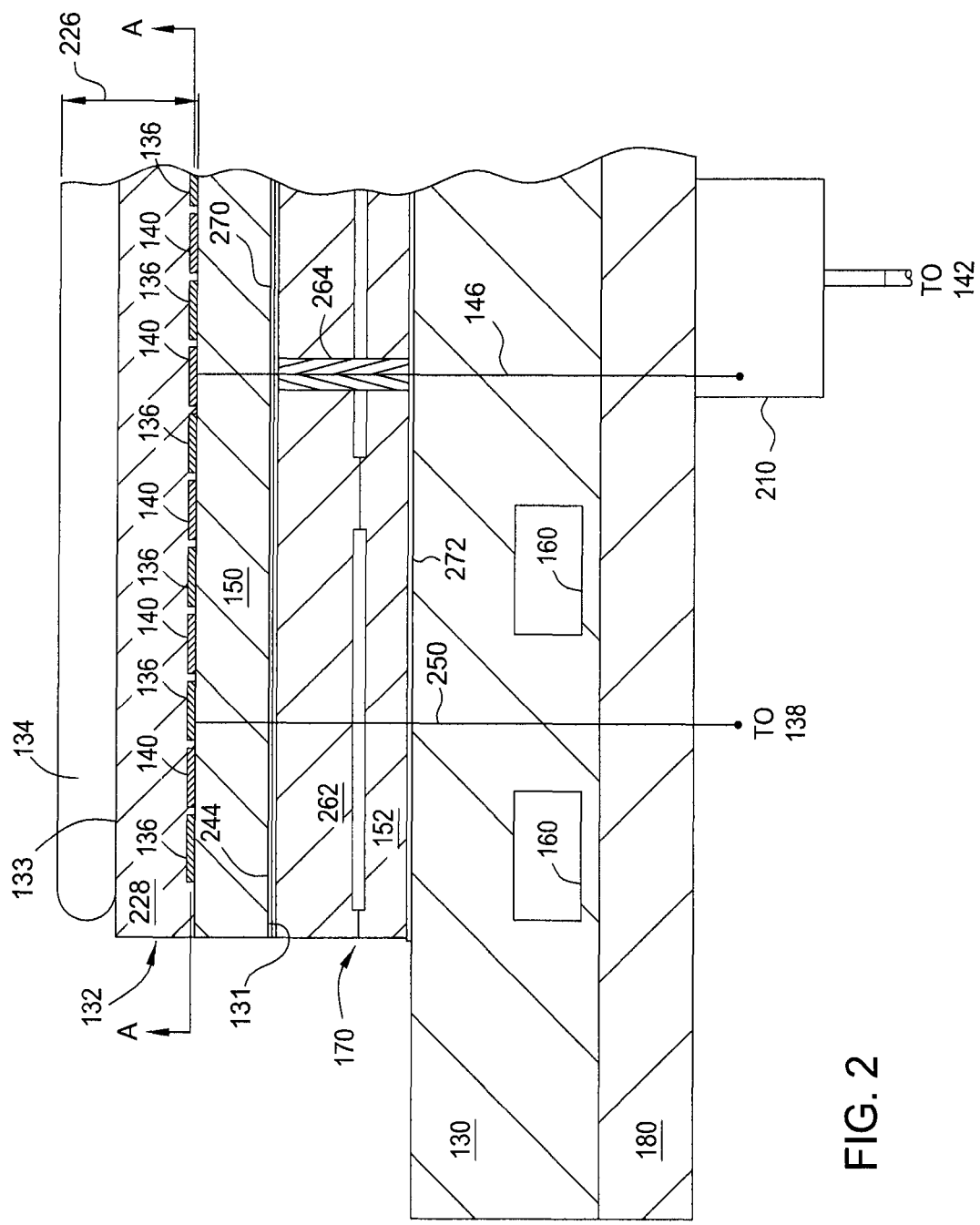
FIG. 2 is a partial cross-sectional schematic side view detailing portions of the pixelated electrostatic chuck and substrate support assembly.

FIG. 2 is a partial cross-sectional schematic view illustrating portions of the substrate support assembly 126. Included in FIG. 2 are portions of the pixelated ESC 132, the heater assembly 170, the cooling base 130, and the facility plate 180.

The heater assembly 170 may be optional and have an insulated region 264. The insulated region 264 may protect the heater assembly 170 from the electrical leads 146 connecting the pixel electrodes 140 to the ground 142 through the pixel capacitors and the pixel controller 210. Embodiments in which the main resistive heaters 154 are in the pixelated ESC 132, the heater assembly 170 may be absent from the substrate support assembly 126.

The heater assembly 170 may be coupled to the mounting surface 131 of the pixelated ESC 132 utilizing a bonding agent 244. The bonding agent 244 may be an adhesive, such as an acrylic-based adhesive, an epoxy, a silicon based adhesive, a neoprene-based adhesive or other suitable adhesive. In one embodiment, the bonding agent 244 is an epoxy. The bonding agent 244 may have a coefficient of thermal conductivity selected in a range from 0.01 to 200 W/mK and, in one exemplary embodiment, in a range from 0.1 to 10 W/mK. The adhesive materials comprising the bonding agent 244 may additionally include at least one thermally conductive ceramic filler, e.g., aluminum oxide ($Al_2O_3$), aluminum nitride (AlN), and titanium diboride ($TiB_2$), and the like. The bonding agent 244 may be removed when refurbishing the pixelated ESC 132 or the heater assembly 170. In other embodiments, the pixelated ESC 132 is removably coupled to the heater assembly 170 utilizing fasteners or clamps (not shown).

The body 150 of the pixelated ESC 132 may generally be cylindrical in plan form, but may also be formed in other geometrical shapes. The body 150 may be ceramic and sintered into the puck 228 illustrated in FIG. 2. The puck 228 has a workpiece surface 133 to support the substrate 134 thereon. The body 150 may additionally include a mounting surface 131 facing the heater assembly 170.

The portion of the puck 228 disposed between the electrodes 136, 140 and a top surface of the substrate 134 form a dielectric 226 for capacitively coupling the power to the substrate 134. More power coupled to the substrate 134, resulting from a thicker depth of the dielectric 226, or a flatter topography for the puck 228, can lower the etch rate, and vice versa. The coupling of power to the substrate 134 plays an important role in forming semiconductor technology nodes smaller than 10 nm as temperature uniformity even as low as 0.25° Celsius is not sufficient in maintaining good lateral etch uniformity. Accordingly, it has been found that independent control of the power coupling between the substrate 134 and the pixelated ESC 132 at discrete locations laterally across the pixelated ESC 132 allows the etch rate to be independently controlled at each location of the pixelated ESC 132 associated with one of the pixel electrodes 140 and its surrounding chucking electrode 136.

A conventional ESC may have different capacitance at discreet locations between the substrate and the chucking electrodes depending on the ESC design and material used. For example, the capacitance between a perfectly flat wafer and the conventional ESC which is perfectly flat may be about 220 pF. Considering variation in the puck surface flatness and roughness, and other factors such as the dielectric depth, distance of chucking electrode from ESC surface, and material of the puck, among other factors, the capacitance can be much higher in one region of the ESC as compared to other regions. For example, some conventional ESCs may have a variance in capacitance across the substrate supporting surface of about several thousand pico-faradays.

Embodiments of the pixelated ESC 132 described herein allow control of the etch rate uniformity to within about 5 Å by controlling the local capacitance variation across the substrate support surface of the pixelated ESC 132 to less than 10%. For example, the local capacitance variation across the substrate support surface of the pixelated ESC 132 may be controlled to between about 20 pF to about several hundred pico-faradays.

In one or more embodiments, the local capacitance variation across the substrate support surface of the pixelated ESC 132 may be controlled by sufficiently tightening the tolerance for the depth of the dielectric 226 in order to achieve a capacitance variation of less than 10%. For example, the tolerance for the depth of the dielectric 226 may be tightened to less than about 5%, if the other 5% is related to doping variations, to achieve a capacitance variation of less than 10%.

In addition to, or in the alternative of tightening the tolerance for the depth of the dielectric 226, the local capacitance variation across the substrate support surface of the pixelated ESC 132 may be controlled by sufficiently improving the flatness and topographical uniformity of the surface for the puck 228. For example, the tolerance of the flatness of the puck 228 may be less than about 10 µm. In addition to, or in the alternative to improving the flatness of the puck 228, the surface roughness variation of the puck 228 may be less than about 10 µm.

In addition to, or in the alternative of improving one or more of the physical attributes (i.e., depth tolerance, flatness, roughness, and the like) of the dielectric 226 and puck 228, the local capacitance variation across the substrate support surface of the pixelated ESC 132 may be controlled by selecting an appropriate capacitance for each of the pixel capacitors coupled to the individual pixel electrodes 140. By selecting an appropriate capacitance for each of the pixel capacitors coupled to the individual pixel electrodes 140, variation of the physical attributes of the dielectric 226 and puck 228, or variation in the processing environment, may be compensated to achieve desired processing results, such as maintaining etch rate uniformity to within about 5 Å.

The pixel controller 210 may be utilized to select an appropriate capacitance for each of the pixel capacitors coupled to the individual pixel electrodes 140. For example, the pixel controller 210 may control the capacitance of each the pixel capacitor utilizing control signals generated by the pixel controller 210.

The use of independently controllable pixel capacitors to smooth out or correct the power coupling profile of the pixelated ESC 132 enable control of the local RF uniformity across the substrate 134 to very small tolerances. The local RF uniformity across the substrate 134 enables precise process and CD control when processing the substrate 134. Additionally, the small size and high density of the pixel electrodes 140 enable discreet local control of power coupling between a single pixel electrode 140 and the adjacent chucking electrode 136 through the substrate 134 without substantially affecting the power coupling of neighboring regions of the pixelated ESC 132, thereby allowing local control of the power coupling. The substrate support assembly 126, having a plurality of pixel electrodes 140, has demonstrated the ability to control the capacitance uniformity of the substrate 134 processed thereon to less than about 10%, resulting in control of process deviations in etch uniformity down to about 5 Å.

FIG. 3 is a partial top plan cross sectional view of the pixelated ESC 132 taken along the section line A-A of FIG. 2. The layout of the pixel electrodes 140 and chucking electrodes 136 in the pixelated ESC 132 is provided by way of example, and arranged in alternative manners. The pixel electrodes 140 are disposed along the plane of the cross section line A-A through the pixelated ESC 132 in FIG. 2. The number of pixel electrodes 140 and chucking electrodes 136 shown are for illustration only, and any number of embodiments may have substantially more (or less) pixel electrodes 140 and chucking electrodes 136. Additionally, the chucking electrodes 136 may be in the form of independently biasable segments, as a plurality of commonly biased segments, or other configuration. The local capacitance across the workpiece supporting surface of the pixelated ESC 132 can be controlled by the pixel capacitors to provide Angstrom-level control of the etch rate.

The pixel controller, such as the pixel controller 210 shown in FIG. 2, may control each pixel capacitor. In one embodiment, the pixel capacitors and switches for coupling pixel capacitors to selected pixel electrodes 140 are disposed in the pixel controller 210. The pixel controller 210 may couple a single pixel electrode 140 to a capacitor having the same or different capacitance as neighboring pixel electrodes 140. In other embodiments, the pixel controller 210 may couple a group of adjacent pixel electrodes 140 to capacitors having the same capacitance, which may be the same or different than the capacitance of neighboring groups of pixel electrodes 140, thereby defining a portion or a zone of the pixelated ESC 132 which may be controlled independently from other zones. The pixel controller 210 may couple a plurality of pixel electrodes 140 grouped to define an inner wedge, a perimeter group, a pie shaped area, or other desired geometric configuration, including non-contiguous configurations. Thus, by controlling the local capacitance of each pixel electrode 140, RF coupling can be precisely controlled at independent locations along the surface of the pixelated ESC 132 which enables more precise control of substrate processing results. Although the pattern shown for the pixel electrodes 140 is arranged as a grid of small units, the pattern may alternatively have larger and/or smaller units, extending to the edge, or in other arrangements.

The number of pixel electrodes 140 may be substantially equal to the number of chucking electrodes 136. Alternately, the number of pixel electrodes 140 may substantially exceed or be less than the number of chucking electrodes 136. The number of pixel electrodes 140 located across the substrate support assembly 126 may easily be in excess of several hundred. In one embodiment, there is a corresponding pixel electrode 140 for each chucking electrode 136. In an alternate embodiment, there are corresponding groups of pixel electrodes 140 for one or more chucking electrode.

The pixel electrodes 140 may be configured in a pattern to efficiently generate a desired RF coupling profile between the substrate and the ground. The pattern may be grid (as shown) symmetric about a midpoint, or other suitable pattern which provides clearance in and around holes for lift pins or other mechanical, fluid or electrical connections and ports (not shown).

FIG. 4 is a cross-sectional view of the pixelated ESC 132 taken along the section line B-B of FIG. 3. FIG. 4 illustrates a simplified exemplary wiring schematic for capacitors coupled to the pixel electrodes 140 in the pixelated ESC 132. The pixelated ESC 132 in FIG. 4 shows the pixel electrodes 140 and the chucking electrodes 136 formed therein. The pixel electrodes 140 are coupled to one or more capacitors 440, for example, residing in a capacitor bank 410. The capacitor bank 410 may be deposed in the pixel controller 210 or other suitable location. The capacitors 440 may have a fixed or variable capacitance. In embodiments wherein the capacitance is variable, the capacitance of the capacitor 440 may be selected in response to a signal from the pixel controller 210.

The pixel controller 210 may have a controller 412 for opening and/or closing individual circuits that selectively couple capacitors 440 to respective pixel electrodes 140 via electrical leads 141. When the circuits of the pixel controller 210 are in a closed position, the pixel electrode 140 is coupled through at least one of the capacitors 440 to ground 142. In one embodiment, the controller 412 may connect the pixel electrode 140F and capacitor 440F via the electrical lead 141F to ground 142, while one or more of the other capacitors 440 are floating with respect to ground 142 (as those circuits are in an open state). In this configuration, the area of the pixelated ESC 132 local to the pixel electrode 140F may have stronger coupling of the RF then, for example the area of the pixelated ESC 132 local to the electrode 140G. The controller 412 may control the duration or duty cycle for which the pixel electrode 140F and capacitor 440F are to ground 142 or in a floating state relative to ground. The controller 412 may additionally control the duration or duty cycle for which the other pixel electrodes 140 and capacitors 440 are to ground 142 or in a floating state relative to ground relative to the pixel electrode 140F or other pixel electrode 140. In this manner, the relative capacitance at each location across the substrate support surface of the pixelated ESC 132 may be controlled over time, thereby allowing control of the local RF coupling and, accordingly, enabling local processing results to be tailored as desired.

In another embodiment in addition to or in the alternative to controlling the duty cycle and duration of the relative connections between the pixel electrodes 140 and ground, the controller 412 may programmatically vary the capacitance for each capacitor 440 such that the relative capacitance at each location across the substrate support surface of the pixelated ESC 132 may be controlled. The number and density of the pixel electrodes 140 contribute to the ability for controlling the uniformity of the RF coupling across the substrate 134 to very small tolerances. Thus, individual control of the capacitance between each pixel electrode 140 and ground relative to another pixel electrode 140 enables local and lateral control of RF coupling at specific locations between the substrate 134 and pixelated ESC 132, which, in turn, enables precise process and CD control while processing the substrate 134.

Figure 5:
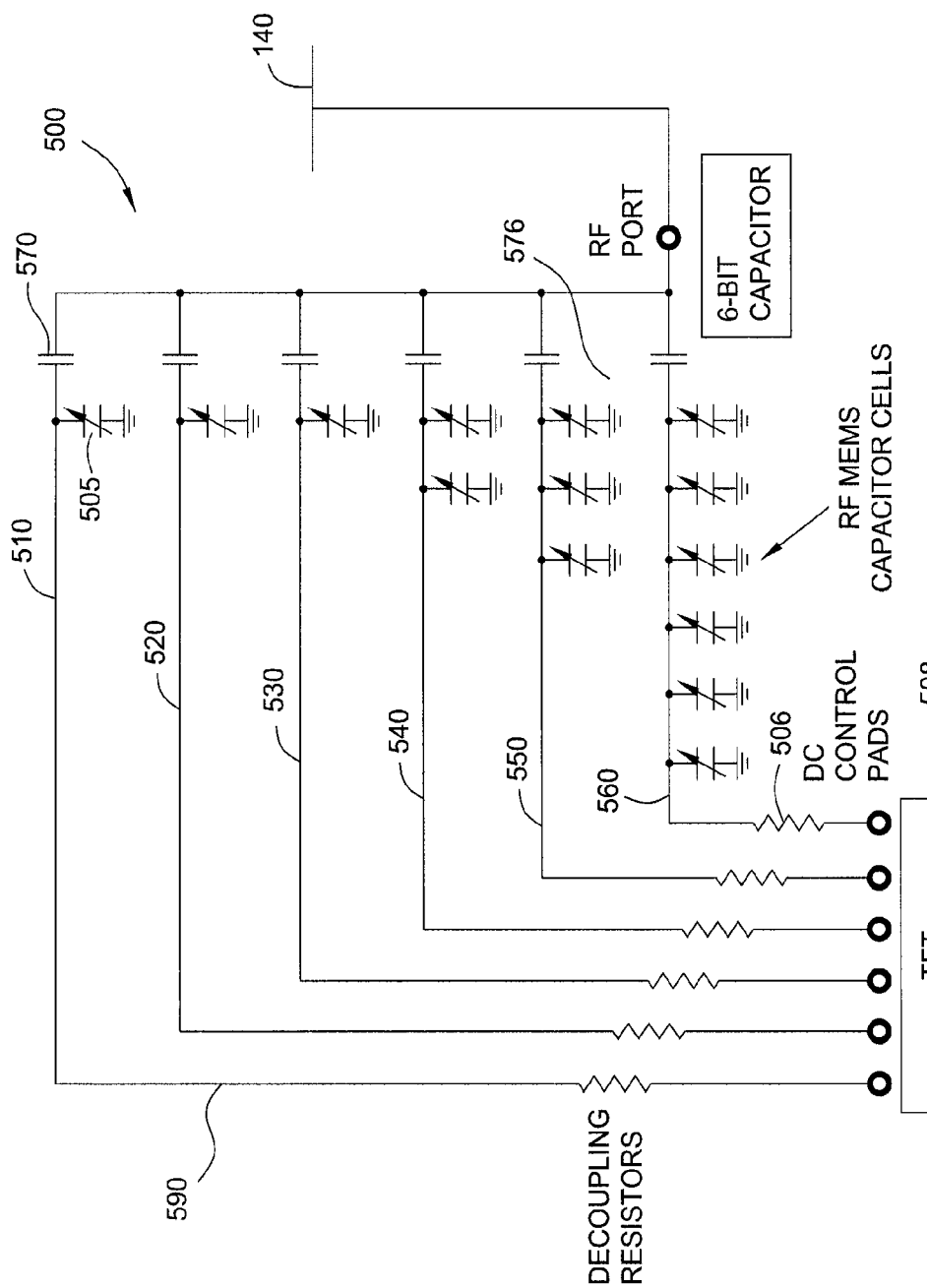
FIG. 5 is a partial wiring schematic illustrating RF variable capacitors.

FIG. 5 illustrates one embodiment of a partial wiring schematic for a variable capacitor 500 for coupling a pixel electrode 140 to ground 142. The variable capacitor 500 may be utilized in the pixel controller 210 described above between any of the pixel electrodes 140 and ground 142, for example by replacing the capacitor 440 shown in FIG. 4. The variable capacitor 500 may include a mix of variable capacitors 505 and fixed capacitors 570, coupled through decoupling resistors 506 to a thin-film transistor 508 (TFT). The variable capacitor 500 general functions as a voltage controlled variable capacitor (varactor), and may utilized the MEMs control elements as the variable capacitors 505. The variable capacitor 500 includes branches 510, 520, 530, 540, 550, 560, where each branch includes at least one variable capacitor 505 and at least one fixed capacitor 570.

The variable capacitors 505, when configured as MEMs control elements, are binary (on/off) controlled, i.e. switchable. The variable capacitors 505 may provide between about 0 pF to about 3.4 pF of capacitance to the variable capacitor 500. Each fixed capacitor 570 may provide between about 0.5 pF to about 74 pF of total capacitance to the variable capacitor 500. Additionally, the decoupling resistors 506, disposed between the TFT 508 and the capacitors 505, 570, may individually provide about 5 ohms of resistance.

The capacitance to the variable capacitor 500 may be configured with selectable binary weighted capacitance along one or more branches 510, 520, 530, 540, 550, 560 comprising the variable capacitor 500. The TFT 508 may be used to select which one or more of the branches 510, 520, 530, 540, 550, 560 are floating, and which one or more the branches 510, 520, 530, 540, 550, 560 couple the pixel electrode 140 to ground 142.

The total capacitance for each branch 510, 520, 530, 540, 550, 560 is the combination of the two sets of capacitors, i.e. the variable capacitor 505 and the fixed capacitor 570. Each branch 510, 520, 530, 540, 550, 560 may have the same range of capacitance or different capacitances. For example, the branch 560 may be configured the largest total capacitance, with the branch 550 configured the next largest total capacitance, and so on with the branch 510 having the smallest total capacitance. Branch 560 may consist of six switchable variable capacitors 505 each having a capacitance set to about 3.4 pF for a total of about 20.4 pF, and be arranged in parallel with the fixed capacitor 576 having a capacitance of about 74 pF. This yields 16 pF of total capacitance for the branch 560. The branches 550, 540, 530, 520, 510 are similarly constructed, and may have 8, 4, 2, 1, and 0.5 pF total capacitance respectively. The branches 530, 520, 510 having a total capacitance of less than 3.4 pF may use a single MEMs variable capacitor 505 in parallel or series with a single fixed capacitor 570. The fixed capacitor 570 may be configured to reduce the total capacitance for the branches 530, 520, 510 to the desired value. For example, the smallest branch 510 may have a single variable capacitor 505 in parallel with a fixed capacitor 570 of about 0.6 pF. Thus, the smallest branch 510 may have an effective capacitance of 0.5 pF when the variable capacitor 505 is actuated, i.e. switched on. Therefore, by selectively switching the variable capacitors 505 on/off in the various branches 510, 520, 530, 540, 550, 560, a total capacitance of between about 0.5 pF to about 31.5 pF may be obtained.

Alternately, the fixed capacitors 576 may be in series with the RF MEMs capacitor cells, such as the MEMs variable capacitor 505. One or more inline capacitors may connect in series to the pixel electrode 140. In such a configuration, the capacitors 576, 505 may be subject to higher voltages than in configurations where the capacitors 576, 505 are placed in parallel. Thus, a series configuration for the RF MEMs capacitor cells, such as the MEMs variable capacitor 505, may be configured for handling high voltages.

Figure 6:
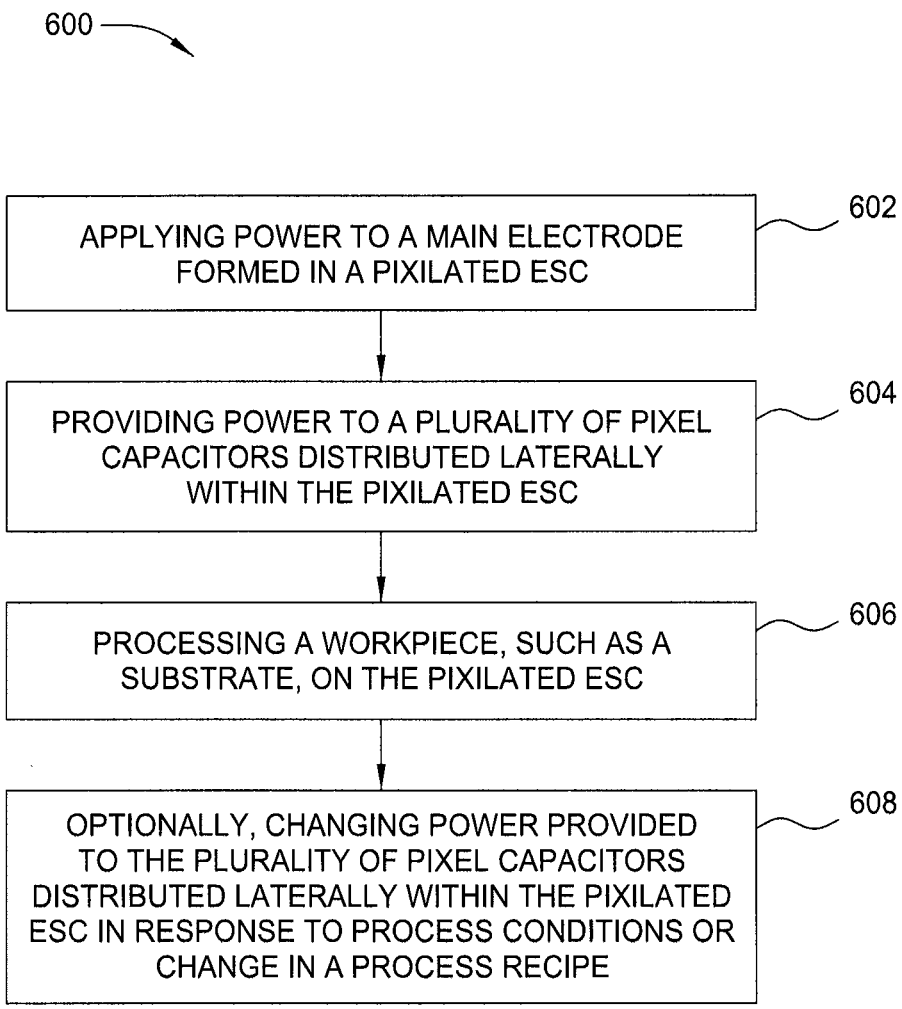
FIG. 6 is a flow diagram of one embodiment for processing a substrate utilizing a pixelated electrostatic chuck.

FIG. 6 is a flow diagram of one embodiment for a method 600 for processing a substrate utilizing a pixelated electrostatic chuck, such as the pixelated electrostatic chuck described above, among others. The method 600 begins at block 602 by applying power to a main electrode formed in the pixelated electrostatic chuck. The main electrode may be a single electrode, or segmented into zones. The zones of the main electrode in the pixelated electrostatic chuck may be independently controllable.

At block 604, one or more of the plurality of pixel electrodes distributed laterally within the pixelated electrostatic chuck are selectively coupled to ground, effectively chucking that substrate to the surface of the electrostatic chuck. The duration and/or duty cycle of the coupling of each pixel electrode to ground may be controlled relative to the other pixel electrodes disposed within the pixelated electrostatic chuck to control the RF coupling to a substrate disposed on the electrostatic chuck. In some embodiments, the coupling of each pixel electrode to ground may be sequentially scanned across the pixelated electrostatic chuck. In other embodiments, the capacitance between a single pixel electrode to ground may be controllably selected relative to the ground paths of the other pixel electrodes disposed within the pixelated electrostatic chuck, optionally in addition to duration and/or duty cycle of the coupling of each pixel electrode to ground. By tailoring the local capacitance between the pixel electrode and ground, the local, lateral, and/or azimuthal tuning of processing results cross the substrate may be realized.

At block 606, the substrate may be processed on the pixelated electrostatic chuck. For example, the substrate may be processed in a vacuum chamber, for example using a plasma process. The vacuum process, which may be optionally performed in the presence of a plasma within the processing chamber, may be one of etching, chemical vapor deposition, physical vapor deposition, ion implantation, plasma treating, annealing, oxide removal, abatement or other plasma process. It is contemplated that the workpiece may be processed on the RF controlled surface of the pixelated electrostatic chuck in other environments, for example, at atmospheric conditions, for other applications. In one embodiment, the substrate on the pixelated electrostatic chuck is etched to form sub 10 nm semiconductor technology nodes.

Optionally, at block 606, coupling between one or more of the plurality of pixel electrodes distributed laterally within the pixelated electrostatic chuck and ground may be changed in response to a change in process conditions or a change in a process recipe. For example, the capacitance between one or more of the pixel electrodes and ground may be changed utilizing commands from the pixel controller 210 in response a change in process conditions or a change in a process recipe. In another example, coupling of one or more of the pixel electrodes may be switched between floating and ground utilizing commands from the pixel controller 210 in response a change in process conditions or a change in a process recipe.

While the foregoing is directed to implementations of the present invention, other and further implementations of the invention may be devised without departing from the basic scope thereof, and the scope thereof is determined by the claims that follow.

We claim:

1. A chucking circuit for an electrostatic chuck (ESC), the chucking circuit comprising:
   a dielectric body having a workpiece support surface, the dielectric body comprising:
      a chucking electrode disposed therein; and
      a pixel electrode disposed in the dielectric body, the pixel electrode switchable between a floating state and a grounded state, wherein the pixel electrode is electrically coupled to a voltage controlled variable capacitor circuit to a ground when in the grounded state; and
   a chucking circuit that includes the chucking electrode and the pixel electrode, the chucking circuit operable to electrostatically chuck a substrate to the workpiece support surface.

2. The chucking circuit of claim 1, wherein the voltage controlled variable capacitor circuit further comprises:
   a plurality of branches having decoupling resistors, the branches comprising:
      a plurality of variable capacitors; and
      a plurality of fixed capacitors coupled with the variable capacitors on a respective branch; and
   a thin-film transistor coupled to the plurality of branches.

3. The chucking circuit of claim 2, wherein the plurality of branches comprise six branches having a respective decoupling resistor providing about 5 ohms of resistance.

4. The chucking circuit of claim 2, wherein the thin-film transistor selects which one or more of the branches are floating, and which one or more the branches couple the pixel electrode to the ground.

5. The chucking circuit of claim 2, wherein the total capacitance for each branch of the plurality of branches is a summation of the respective variable capacitor and the respective fixed capacitor.

6. The chucking circuit of claim 2, wherein a first branch of the plurality of branches consist of six variable capacitors each having a capacitance of about 3.4 pF, and the six variable capacitors are arranged in parallel with a first fixed capacitor having a capacitance of about 74 pF, and wherein the first branch has a total capacitance of about 16 pF.

7. The chucking circuit of claim 2, wherein a second through sixth branch are similarly constructed, and have a total capacitance of about 8 pF, 4 pF, 2 pF, 1 pF, and about 0.5 pF respectively.

8. The chucking circuit of claim 7, wherein the fourth through sixth branches having a total capacitance of less than 3.4 pF use a single MEMs variable capacitor in parallel or series with the respective fixed capacitor.

9. The chucking circuit of claim 2, wherein the variable capacitors may provide between about 0 pF to about 3.4 pF.

* * * * *

UNITED STATES PATENT AND TRADEMARK OFFICE
CERTIFICATE OF CORRECTION

PATENT NO. : 9,805,965 B2  Page 1 of 1
APPLICATION NO. : 15/395938
DATED : October 31, 2017
INVENTOR(S) : Reza Sadjadi et al.

It is certified that error appears in the above-identified patent and that said Letters Patent is hereby corrected as shown below:

On the Title Page

In item (57), in Column 2, in "Abstract", Line 2, delete "pixilated" and insert -- pixelated --, therefor.

In the Specification

In Column 1, Line 13, delete "61/984,519," and insert -- 61/948,519, --, therefor.

In Column 1, Line 56, delete "pixilated" and insert -- pixelated --, therefor.

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*